(12) United States Patent
Kang et al.

(10) Patent No.: US 8,848,450 B2
(45) Date of Patent: Sep. 30, 2014

(54) METHOD AND APPARATUS FOR ADJUSTING MAXIMUM VERIFY TIME IN NONVOLATILE MEMORY DEVICE

(75) Inventors: Dong Ku Kang, Yongin-si (KR); Seung-Bum Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 345 days.

(21) Appl. No.: 13/281,793

(22) Filed: Oct. 26, 2011

(65) Prior Publication Data

US 2012/0120730 A1    May 17, 2012

(30) Foreign Application Priority Data

Nov. 15, 2010  (KR) .......................... 10-2010-0113469

(51) Int. Cl.
| | |
|---|---|
| G11C 11/34 | (2006.01) |
| G11C 11/56 | (2006.01) |
| G11C 16/08 | (2006.01) |
| G11C 16/04 | (2006.01) |
| G11C 16/34 | (2006.01) |

(52) U.S. Cl.
CPC ............ *G11C 16/08* (2013.01); *G11C 11/5628* (2013.01); *G11C 16/0483* (2013.01); *G11C 16/3454* (2013.01)

USPC .................................................... 365/185.22

(58) Field of Classification Search
USPC .................................................... 365/185.22
See application file for complete search history.

(56) References Cited

U.S. PATENT DOCUMENTS

| | | | |
|---|---|---|---|
| 6,028,792 A | 2/2000 | Tanaka et al. | |
| 7,701,768 B2 | 4/2010 | Hwang | |
| 2006/0291290 A1* | 12/2006 | Kim et al. | 365/185.22 |
| 2009/0040836 A1* | 2/2009 | Lee | 365/185.22 |
| 2010/0008138 A1* | 1/2010 | Wang | 365/185.03 |
| 2011/0194346 A1* | 8/2011 | Yoon et al. | 365/185.03 |
| 2012/0320675 A1* | 12/2012 | Kang | 365/185.03 |

FOREIGN PATENT DOCUMENTS

| | | |
|---|---|---|
| JP | 10214492 | 8/1998 |
| KR | 100272035 | 11/2000 |
| KR | 1020080113918 A | 12/2008 |
| KR | 1020080114203 A | 12/2008 |

* cited by examiner

*Primary Examiner* — Tuan T Nguyen
*Assistant Examiner* — Khamdan Alrobaie
(74) *Attorney, Agent, or Firm* — Volentine & Whitt, PLLC

(57) ABSTRACT

A nonvolatile memory device is programmed by decoding a received address, determining whether the received address is a first type of page address or a second type of page address, adjusting a maximum verify time of a program loop used to verify a program state of page data according to the determined type of page address, and performing a verify operation during the adjusted maximum verify time.

19 Claims, 17 Drawing Sheets

METHOD AND APPARATUS FOR ADJUSTING MAXIMUM VERIFY TIME IN NONVOLATILE MEMORY DEVICE

CROSS-REFERENCE TO RELATED APPLICATIONS

This application claims priority under 35 U.S.C. §119 to Korean Patent Application No. 10-2010-0113469 filed on Nov. 15, 2010, the disclosure of which is hereby incorporated by reference in its entirety.

BACKGROUND OF THE INVENTION

Embodiments of the inventive concept relate generally to electronic memory technologies. More particularly, embodiments of the inventive concept relate to nonvolatile memory devices capable of adjusting a maximum verify time of a program loop according to a page address.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM), and examples of nonvolatile memory devices include flash memory, electrically erasable programmable read-only memory (EEPROM), and resistive random access memory (RRAM).

A flash memory device comprises a plurality of memory cells arranged in a memory cell array. The memory cell array is organized in a plurality of memory blocks, with each of the memory blocks comprising a plurality of pages. Each of the plurality of pages comprises a plurality of memory cells. The flash memory device typically performs erase operations on a block-by-block basis, and it performs program operations and read operations on a page-by-page basis.

Each of the plurality of memory cells can be identified as an on-cell or an off-cell according to whether it turns on in response to a predetermined voltage. In other words, the memory cells can be identified as on-cells and off-cells according to their respective threshold voltages. For example, where a memory cell is in an erased state, it may be an on-cell when a voltage of 0V is applied to its control gate. On the other hand, where a memory cell is in a programmed state, it may be an off-cell when the voltage of 0V is applied to its control gate.

In a NAND flash memory device, memory cells are arranged in a cell string structure, where each cell string comprises a plurality of transistors connected in series between a string selection transistor connected to a string selection line (SSL) and a ground selection transistor connected to a ground selection line (GSL). The string selection transistor is connected to a bit line and the ground selection transistor is connected to a common source line (CSL).

Each of a plurality of memory cells can be a single level cell (SLC), which is a memory cell that stores one bit, or a multi level cell (MLC), which is a memory cell that stores more than one bit. An SLC has an erase state and a program state, and an MLC has an erase state and a plurality of program states.

To accurately read stored data, a flash memory device must be able to reliably distinguish between different program states. For this to happen, there must be adequate read margins between threshold voltage distributions corresponding to these program states. Unfortunately, however, these read margins can be diminished by noise that causes the threshold voltage distributions to widen, such as CSL noise.

CSL noise is an undesired change in a voltage of the CSL. CSL noise can alter the amount of current flowing through an on-cell during a read operation or a program operation, which can increase the threshold voltage of the on-cell. For example, even with an identical word line voltage or an identical bit line voltage, the current flowing through the on-cell decreases when a voltage level of a source node of a ground selection transistor increases due to CSL noise. This causes a threshold voltage of the on-cell to increase so it is misinterpreted as an off-cell. This can cause an error in the read or program operation.

SUMMARY OF THE INVENTION

According to one embodiment of the inventive concept, a method of operating a nonvolatile memory device comprises decoding a received address and determining whether the received address is a first type of page address or a second type of page address, adjusting a maximum verify time of a program loop used to verify a program state of page data according to the determined type of page address, and performing a verify operation during the adjusted maximum verify time.

According to another embodiment of the inventive concept, a nonvolatile memory device comprises a memory cell array, control logic, and a voltage supply circuit. The memory cell array comprises a plurality of nonvolatile memory cells connected to a plurality of word lines. The control logic is configured to decode a received address, determine whether the received address is a first type of page address or a second type of page address, adjust a maximum verify time used to verify a program state of selected memory cells in each program loop of a program operation according to the determined type of page address, and output a control code corresponding to the adjustment. The voltage supply circuit is configured to supply a verify voltage to a selected word line connected to the selected memory cells according to the control code.

According to another embodiment of the inventive concept, a method of programming a nonvolatile memory device comprises selecting a page of memory cells, and performing a program operation on the selected page of memory cells, wherein the program operation comprises a plurality of program loops each comprising a program-execution operation and a program-verify operation, and wherein the program-verify operation has a duration that is determined by whether the selected page is a first type of page or a second type of page.

These and other embodiments of the inventive concept can reduce the time required to perform program operations while addressing reliability issues that can arise due to CSL noise.

BRIEF DESCRIPTION OF THE DRAWINGS

The drawings illustrate selected embodiments of the inventive concept. In the drawings, like reference numbers indicate like features.

DETAILED DESCRIPTION

Selected embodiments of the inventive concept are described below with reference to the accompanying drawings. These embodiments are presented as teaching examples and should not be construed to limit the scope of the inventive concept.

In the description that follows, where a feature is referred to as being "connected" or "coupled" to another feature, it can be directly connected or coupled to the other feature or intervening features may be present. In contrast, where a feature is referred to as being "directly connected" or "directly coupled" to another feature, there are no intervening features present. As used herein, the term "and/or" includes any and all combinations of one or more of the associated listed items and may be abbreviated as "/".

The terms first, second, etc., are used herein to describe various features, but these features should not be limited by these terms. Rather, these terms are only used to distinguish one feature from another. For example, a first signal could be termed a second signal, and, similarly, a second signal could be termed a first signal without departing from the disclosed teachings.

The terminology used herein is for the purpose of describing particular embodiments only and is not intended to be limiting. As used herein, the singular forms "a", "an" and "the" are intended to include the plural forms as well, unless the context clearly indicates otherwise. The terms "comprises" and/or "comprising," or "includes" and/or "including," where used in this specification, specify the presence of stated features but do not preclude the presence or addition of one or more other features.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and/or the present application, and should not be interpreted in an idealized or overly formal sense unless expressly so defined herein.

Figure 1:
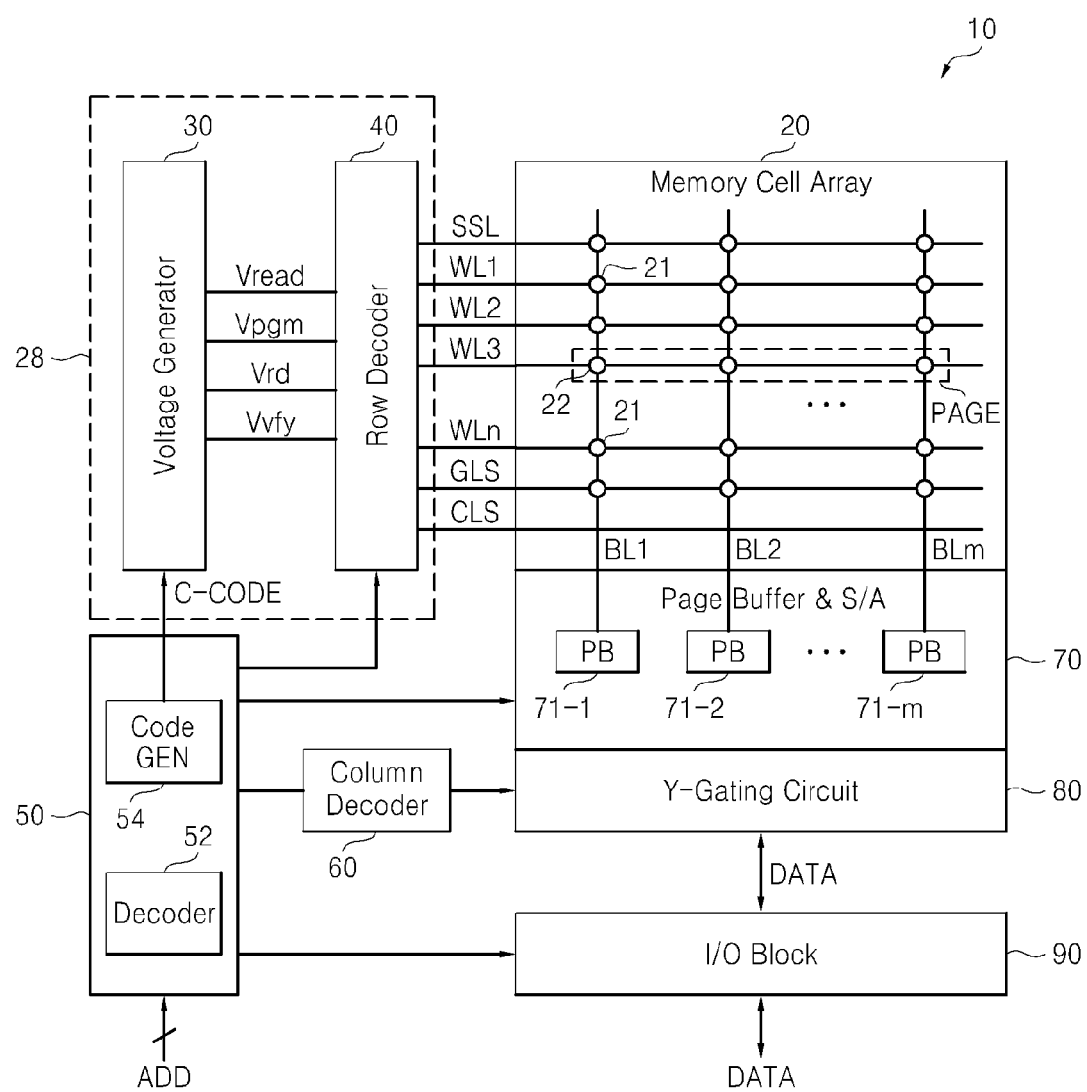
FIG. 1 is a block diagram of a nonvolatile memory device according to an embodiment of the inventive concept.
Figure 2:
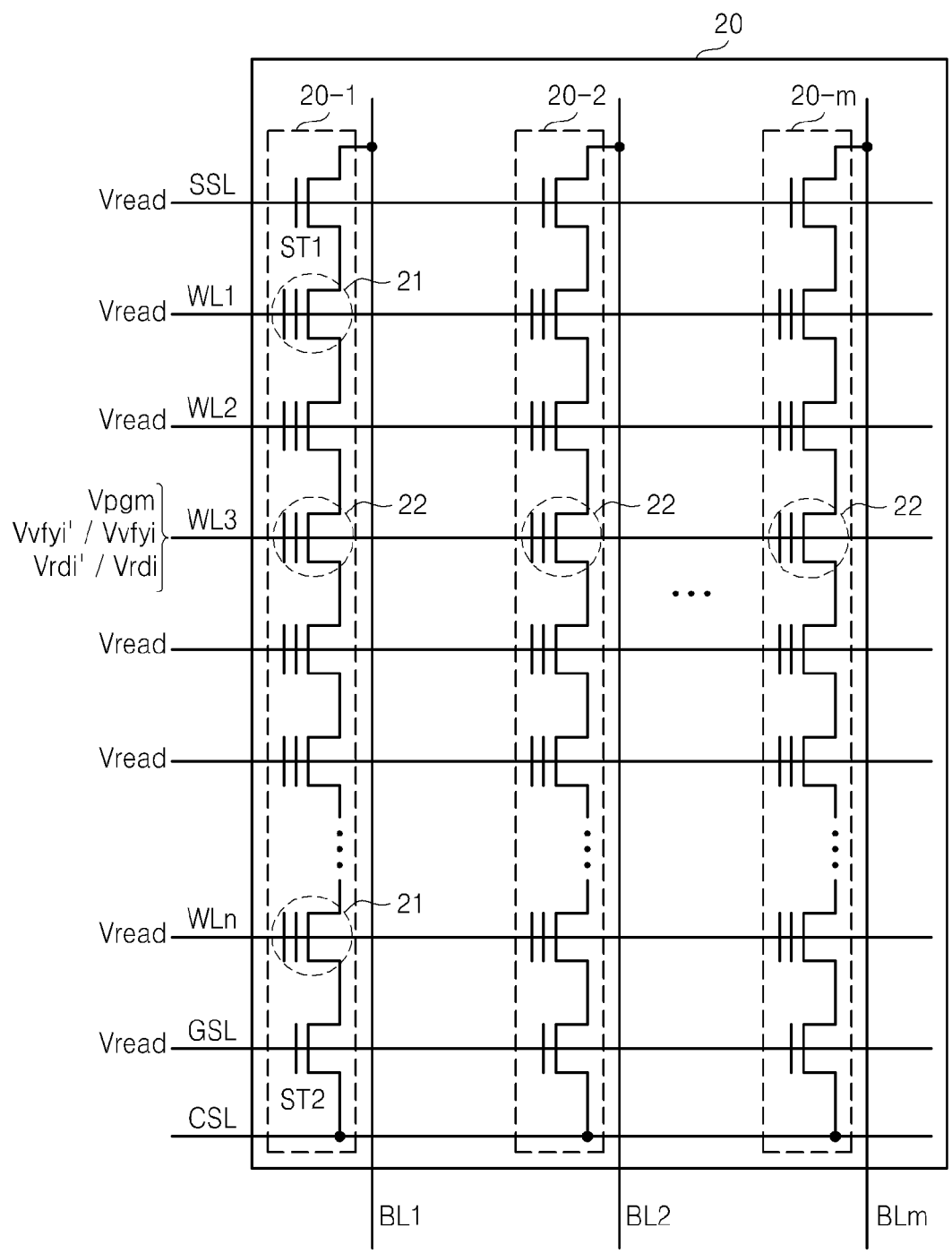
FIG. 2 is a circuit diagram illustrating an embodiment of a memory cell array shown in FIG. 1.
Figure 3:
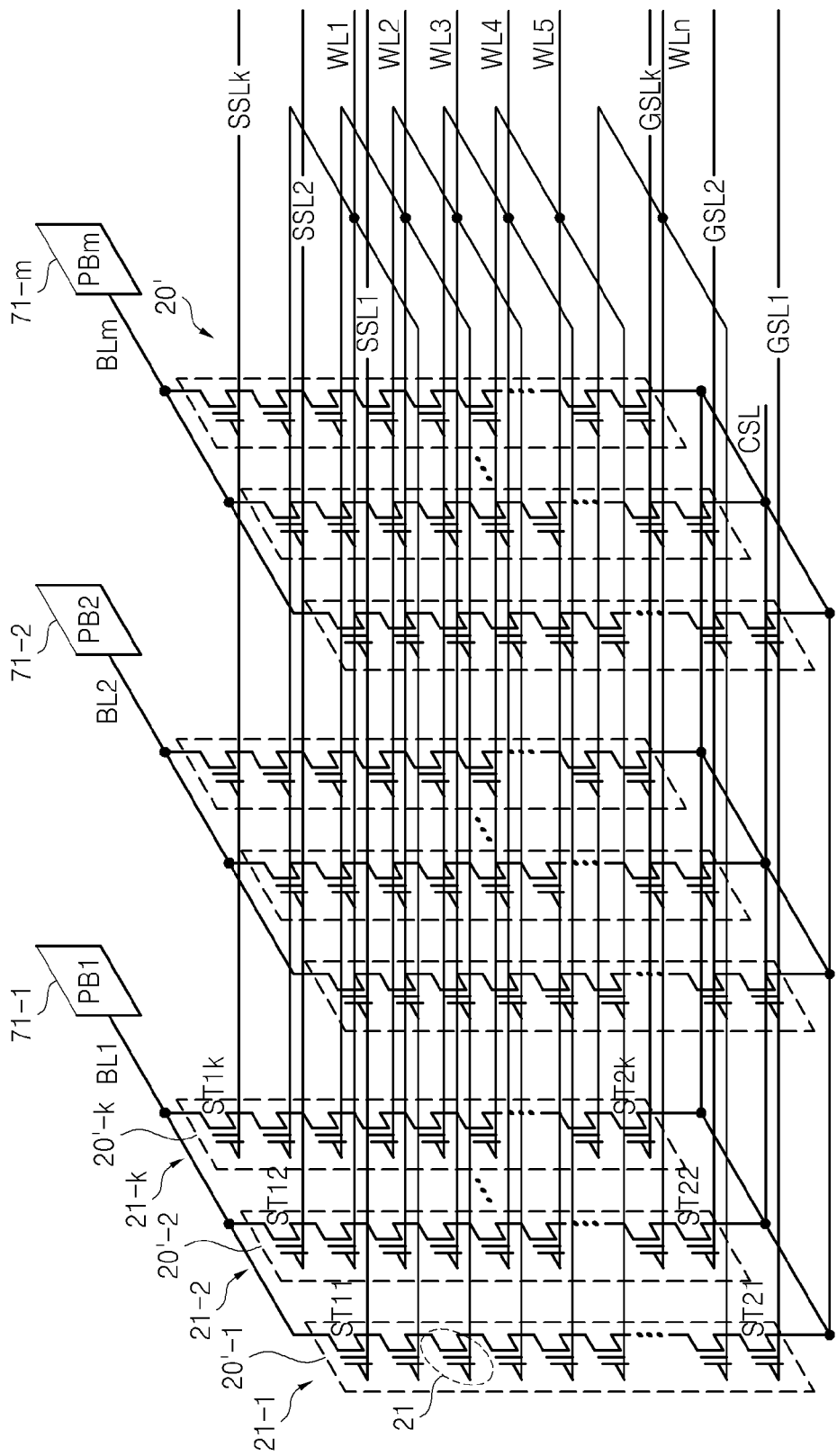
FIG. 3 is a circuit diagram illustrating another embodiment of a memory cell array shown in FIG. 1.

FIG. 1 is a block diagram of a nonvolatile memory device 10 according to an embodiment of the inventive concept. FIG. 2 is a circuit diagram illustrating an embodiment of a memory cell array shown in FIG. 1 and voltages supplied to word lines of the memory cell array during a program verify operation. FIG. 3 is a circuit diagram illustrating another embodiment of the memory cell array illustrated in FIG. 1.

Referring to FIGS. 1 and 2, nonvolatile memory device 10 comprises a memory cell array 20 for storing data, a voltage supply circuit 28, control logic 50, a column decoder 60, a page buffer and sense amplifier (S/A) 70, a Y-gating circuit 80, and an input/output (I/O) block 90. Control logic 50 controls data access operations performed on memory cell array 20. These operations can comprise, for instance, program operations, read operations, and erase operations.

In the embodiment of FIG. 2, memory cell array 20 comprises a plurality of cell strings 20-1, 20-2, . . . , 20-m, and each of cell strings 20-1, 20-2, . . . , 20-m comprises a plurality of nonvolatile memory cells 21 connected in series. Cell strings 20-1, 20-2, . . . , and 20-m are laid out on a two dimensional plane or layer in a NAND flash configuration. The memory cells in memory array 20 can be SLCs or MLCs.

Cell strings 20-1 through 20-m have substantially the same structure, which can be explained by reference to a representative cell string 20-1. Cell string 20-1 comprises a plurality of nonvolatile memory cells 21 connected in series between a first selection transistor (or a string selection transistor) ST1 connected to a bit line BL1 and a second selection transistor (or a ground selection transistor) ST2 connected to a common source line CSL. A gate of first selection transistor ST1 is connected to a string selection line SSL, gates of nonvolatile memory cells 21 are connected to respective word lines WL1 through WLn, and a gate of second selection transistor ST2 is connected to a ground selection line GSL.

In the embodiment of FIG. 3, memory cell array 20 (relabeled as memory cell array 20') comprises cell strings 20'-1, 20'-2, . . . , 20'-k laid out on different three-dimensional planes. In particular, a first cell string 20'-1 is laid out on a first layer 21-1, a second cell string 20'-2 is laid out on a second layer 21-2 which is different from first layer 21-1, and a $k^{th}$ cell string 20'-k is laid out on a layer 21-k which is different from second layer 21-2.

Layers 21-1 through 21-k are formed through a wafer stack, a chip stack or a cell stack. Layers 21-1 through 21-k can be connected through vertical electrical connections such as through-silicon vias (TSVs), solder bumps, or wire bondings. Each of the layers 21-1 through 21-k comprises a plurality of cell strings.

First cell string 20'-1 comprises a plurality of nonvolatile memory cells connected in series between selection transistors ST11 and ST21, second cell string 20'-2 comprises a plurality of nonvolatile memory cells connected in series between selection transistors ST12 and ST22, and $k^{th}$ cell string 20'-k comprises a plurality of nonvolatile memory cells connected in series between selection transistors ST1$k$ and ST2$k$.

Cell strings 20'-1, 20'-2, ..., and 20'-k share a plurality of word lines WL1 through WLn, a CSL, and a bit line BL1. In addition, each of these cell strings is connected to a corresponding one of page buffers 71-1 through 71-$m$ located in a page buffer & sense amplifier (S/A) block 70.

Various types of data access operations can be performed on memory cell array 20, such as program, verify, and read operations. The verify operations include program verify operations and erase verify operations.

A program-verify operation is used to determine whether a threshold voltage of a memory cell 22 selected during a program operation reaches a desired threshold voltage. For example, a program verify voltage Vvfy is applied to a selected word line WL3 connected to a selected memory cell 22 to determine whether it has a threshold voltage higher than program verify voltage Vvfy. An erase-verify operation is used to determine whether a threshold voltage of memory cell 22 selected during an erase operation reaches a desired threshold voltage. For example, an erase verify voltage is applied to word line WL3 to determine whether selected memory cell 22 has a threshold voltage lower than the erase verify voltage.

Control logic 50 outputs a control code C_CODE to control data access operations of memory cell array 20. In response to control code C_CODE, voltage supply circuit 28 supplies program verify voltage Vvfy to a selected word line, e.g., word line WL3, among a plurality of word lines WL1 through WLn, and supplies an unselected read voltage Vread to un-selected word lines during a program verify operation.

Control code C_CODE can be used to determine various parameters, such as a time when program verify voltage Vvfy is supplied to the selected word line, a frequency with which program verify voltage Vvfy is supplied to the selected word line, or a level of program verify voltage Vvfy supplied to the selected word line.

Voltage supply circuit 28 comprises a voltage generator 30 and a row decoder 40. In response to control code C_CODE, voltage generator 30 generates one or more of various control voltages, such as a program voltage Vpgm for a program operation, read voltages Vread and Vrd for a read operation, or an erase voltage for an erase operation. Voltage generator outputs the generated voltage(s) to row decoder 40.

During a program operation, row decoder 40 supplies program voltage Vpgm to the selected word line in response to a row address and supplies a pass voltage to other word lines. The program operation is typically performed using incremental step pulse programming (ISPP).

Figure 5:
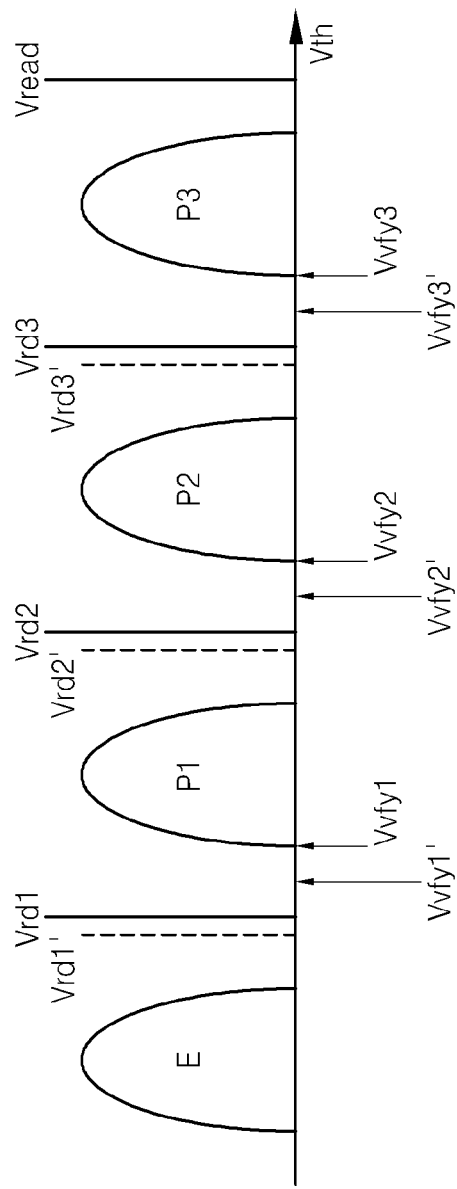
FIG. 5 is a graph illustrating threshold voltage distributions of a plurality of nonvolatile memory cells in the memory cell array illustrated in FIG. 1.

To perform a program verify operation once per program loop, row decoder 40 supplies a program-verify voltage (Vvfyi, i=1, 2 or 3) to selected word line WL3 and supplies an unselected read voltage Vread to other word lines (See, e.g., FIG. 5). In addition, in response to a row address, row decoder 40 supplies a selected read voltage (Vrdi, i=1, 2 or 3) to selected word line WL3 and supplies an unselected read voltage Vread to other word lines during a read operation.

Column decoder 60 decodes a column address under the control of control logic 50 and outputs decoding signals to Y-gating circuit 80. Page buffer & S/A block 70 comprises a plurality of page buffers 71-1 through 71-$m$. Page buffers 71-1 through 71-$m$ are connected to respective bit lines BL1 through BLm.

Each of page buffers 71-1 through 71-$m$ operates as a driver for programming data in memory cell array 20 during a program operation under the control of control logic 50. In addition, each of page buffers 71-1 through 71-$m$ operates as a sense amplifier to sense and amplify each voltage level of bit lines BL1 through BLm during a read operation or a verify operation under the control of control logic 50. Under the control of control logic 50, page buffers 71-1 through 71-$m$ sense and amplify each voltage level of bit lines BL1 through BLm with a program verify voltage Vvfy supplied to selected word line WL3.

Y-gating circuit 80 controls transmission of data between page buffer & S/A block 70 and input/output block 90 in response to decoding signals output from column decoder 60. Input/output block 90 transmits data received from an external source to Y-gating circuit 80 and transmits data output from Y-gating circuit 90 to an external destination through a plurality of input/output pins (or pads). The plurality of input/output pins receive and/or transmit commands, addresses, and data.

Control logic 50 decodes an address ADD transmitted from an external source, such as a memory controller or a host, determines whether address ADD is a first page address or a second page address according to a decoding result, and adjusts a maximum verify time of a program loop for verifying each program state of a page data stored in memory cell array 20, e.g., a physical page PAGE, according to a result of the determination. Then, control logic 50 outputs control code C_CODE corresponding to the adjusted maximum verify time.

Address ADD comprises at least one of a column address, a row address and a page address. The page address comprises an address for an LSB page, an address for a center significant bit (CSB) page or an address for an MSB page related to a word line, e.g., a physical page PAGE.

Hereinafter, an address for an LSB page is referred to as an LSB page address, an address for a CSB page is referred to as a CSB page address, and an address for an MSB page is referred to as an MSB page address. An MLC storing two-bit information comprises logically an LSB page (or a LSB page data) and an MSB page (or MSB page data), which are related to a word line, e.g., a physical page. Similarly, an MLC storing three-bit information logically comprises an LSB page, a CSB page (or CSB page data), and an MSB page, which are related to a word line, e.g., a physical page.

Control logic 50 comprises a decoder 52 and a code generator 54. During a program operation, decoder 52 decodes address ADD, determines whether page data to be programmed in a page of memory cell array 20, e.g., a physical page PAGE, designated according to a decoded address is $N^{th}$ page data or $(N+1)^{th}$ page data, and transmits a result of the determination to code generator 54.

In some embodiments, the $N^{th}$ page data is LSB page data and the $(N+1)^{th}$ page data is MSB page data. In some embodiments, the $N^{th}$ page data is LSB page data or CSB page data, and the $(N+1)^{th}$ page data is MSB page data. Accordingly, address ADD is an LSB page address, a CSB page address, or an MSB page address.

Code generator 54 adjusts a maximum verify time of a unit program loop for verifying each program state of page data stored in a page of memory cell array 20, e.g., a physical page, according to the output of decoder 52, and outputs control code C_CODE corresponding to an adjustment result to voltage generator 30.

Figure 4:
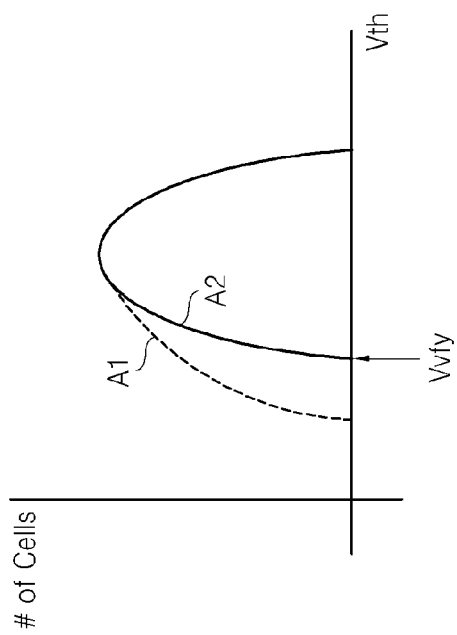
FIG. 4 is a graph illustrating threshold voltage distributions of memory cells programmed with different numbers of program verify operations in each program loop.

FIG. 4 is a graph illustrating threshold voltage distributions of memory cells programmed with different numbers of program verify operations in each program loop.

Referring to FIG. 4, a curve A1 represents a threshold voltage distribution of nonvolatile memory cells where a program-verify operation is performed once per program loop, and a curve A2 represents a threshold voltage distribution of nonvolatile memory cells where two program-verify operations are performed successively in each program loop. The width of curve A2 is narrower than the width of curve A1 on the basis of a program-verify voltage Vvfy.

The two program-verify operations can be performed in each program loop to reduce CSL noise. However, this increases program time and deteriorates program performance.

To prevent the deterioration of program performance, some embodiments determine whether a page data to be programmed is LSB page data, CSB page data, or MSB page data by referring to address ADD, and then they adjust the number of program verify operations per program loop according to the determination.

FIG. 5 is a graph illustrating threshold voltage distributions of a plurality of nonvolatile memory cells in the memory cell array illustrated in FIG. 1. Where memory cells 21 of FIGS. 1 and 2 are MLCs storing two-bit information, nonvolatile memory cells 21 have four states E, P1, P2 and P3 according to a threshold voltage. State E is an erase state and states P1, P2 and P3 are program states.

In a program operation, one or two verify operations are performed in each program loop to determine whether selected memory cells 22 have been programmed to desired states. For LSB data, one verify operation is performed, and for MSB data or CSB data, two verify operations are performed. In a program operation of MSB data, two program-verify operations are performed successively in each program loop using a first program-verify voltage Vvfy1', Vvfy2' or Vvfy3' in the first program-verify operation, and a second program-verify voltage Vvfy1, Vvfy2 or Vvfy3 in the second program-verify operation.

In some embodiments, Vvfy1 is set to be higher than Vvfy1', Vvfy2 is set to be higher than Vvfy2', and Vvfy3 is set to be higher than Vvfy3'. In other embodiments, Vvfy1 is set to be equal to Vvfy1', Vvfy2 is set to be equal to Vvfy2' and Vvfy3 is set to be equal to Vvfy3'.

A read operation can be performed similar to a program-verify operation. For example, to determine each program state E, P1, P2 or P3 for CSB page data or MSB page data, a first read voltage Vrd1', Vrd2' or Vrd3' is supplied to selected word line WL3, and then second read voltage Vrd1, Vrd2 or Vrd3 is supplied to selected word line WL3. To determine each program state E, P1, P2, or P3 for LSB page data or CSB page data, second read voltage Vrd1, Vrd2 or Vrd3 is supplied to selected word line WL3.

In some embodiments, Vrd1 is set to be higher than Vrd1', Vrd2 is set to be higher than Vrd2', and Vrd3 is set to be higher than Vrd3'. In other embodiments, Vrd1 is set to be equal to Vrd1', Vrd2 is set to be equal to Vrd2', and Vrd3 is set to be equal to Vrd3'.

Figure 6:
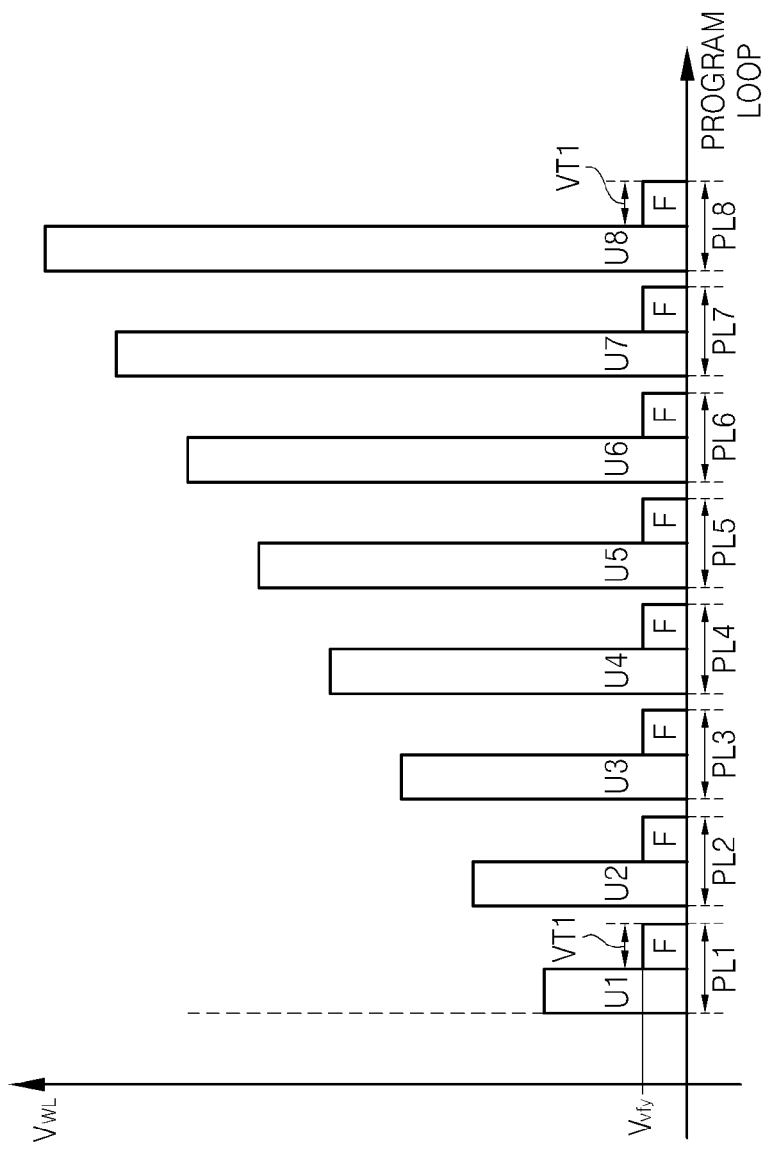
FIG. 6 is a timing diagram for explaining a program operation of least significant bit (LSB) page data in the nonvolatile memory device of FIG. 1.
Figure 7:
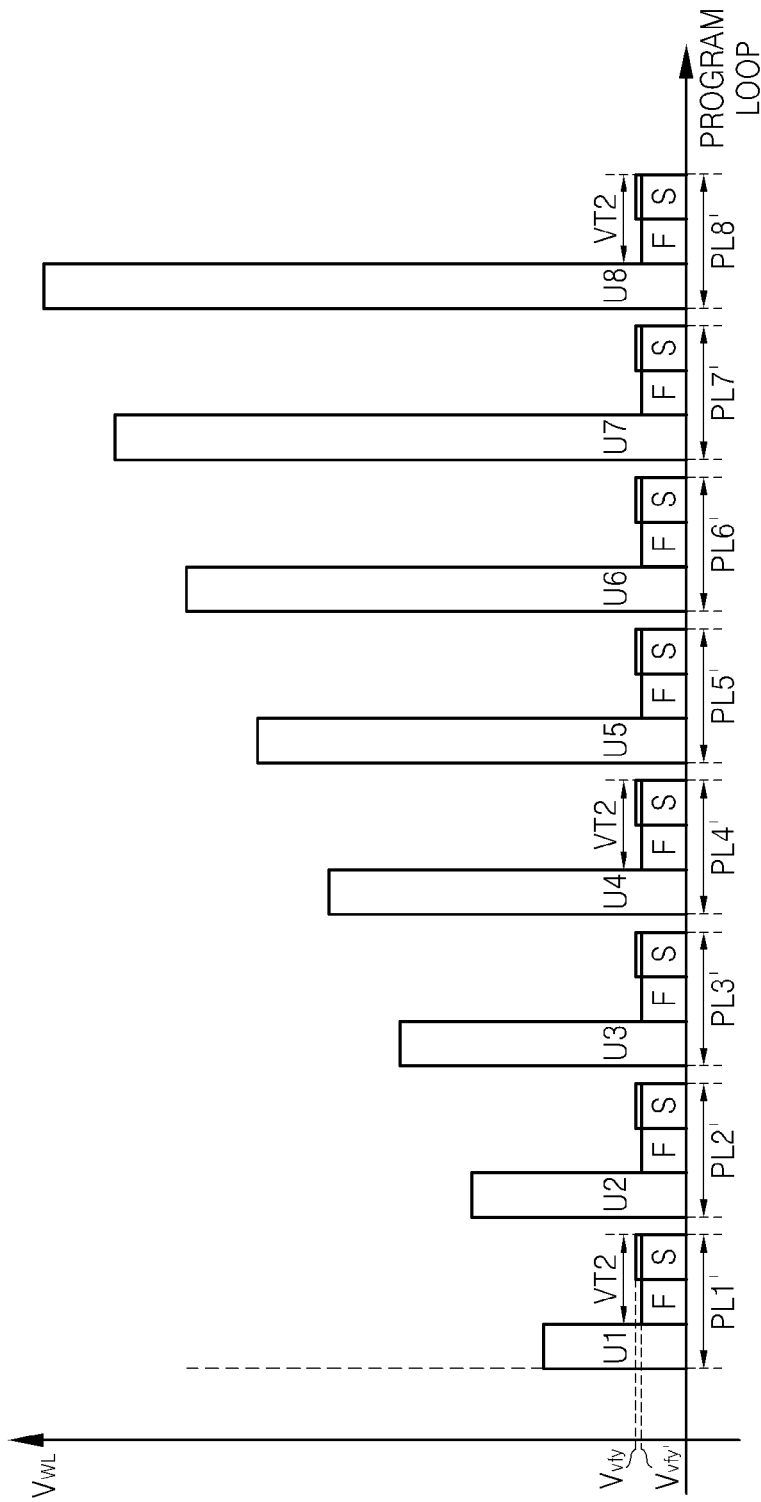
FIG. 7 is a timing diagram for explaining a program operation of most significant bit (MSB) page data in the nonvolatile memory device of FIG. 1.

FIG. 6 is a timing diagram for explaining a program operation of LSB page data performed by the nonvolatile memory device of FIG. 1. FIG. 7 is a timing diagram for explaining a program operation of MSB page data performed by the nonvolatile memory device of FIG. 1, and FIG. 8 is a flowchart for explaining a program operation of a page in a two-bit MLC.

Referring to FIGS. 6 and 7, a program operation comprises a plurality of program loops PL1 through PL8 or PL1' through PL8'. Each program loop comprises a program execution operation and a program-verify operation.

During each program execution operation, one of program pulses U1 through U8 is supplied to selected word line WL3 according to an ISPP scheme. During the program-verify operation, at least one program verify voltage Vvfy1', Vvfy1, Vvfy2', Vvfy2, Vvfy3' or Vvfy3 is provided to selected word line WL3.

Figure 8:
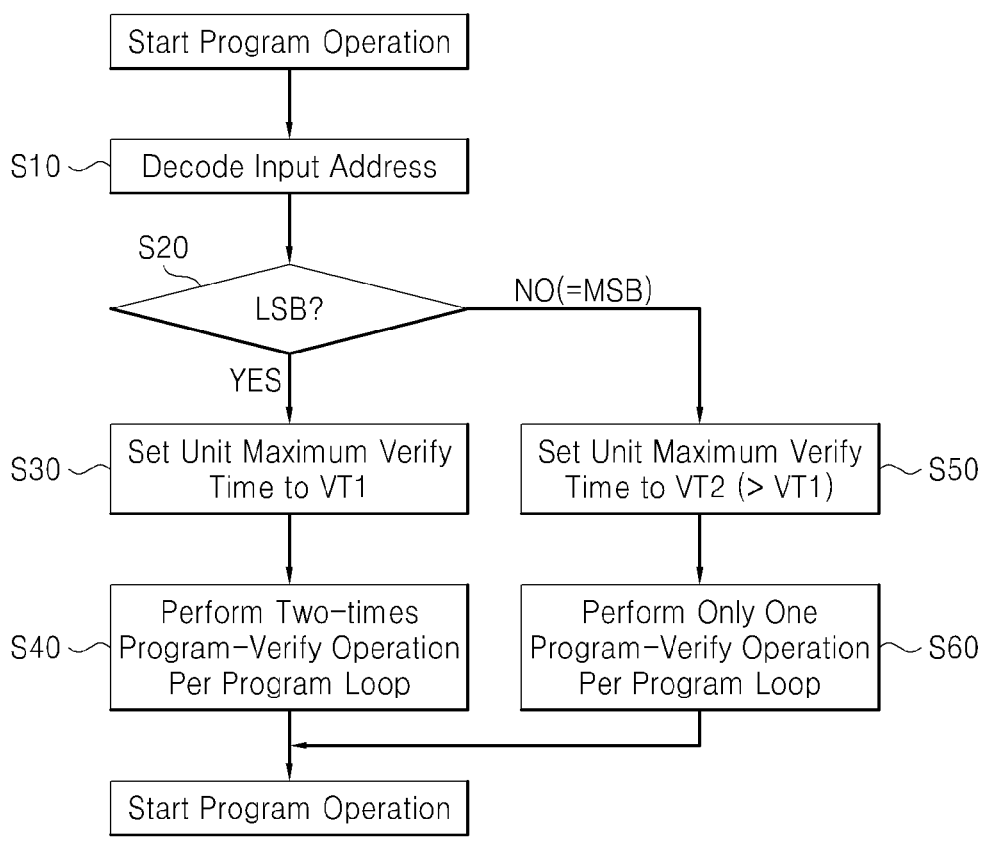
FIG. 8 is a flowchart for explaining a program operation of a page in a two-bit MLC.

Referring to FIGS. 1 and 8, decoder 52 receives and decodes input address ADD for designating a storage location of a page data to be programmed (S10). Decoder 52 determines if the received input address ADD is an LSB page address or an MSB page address (S20). Where the received input address ADD is an LSB page address (S20=Yes), decoder 52 sets a unit maximum verify time of each program loop PL1 through PL8 to a first time VT1 and transmits a result of the setting to code generator 54 as illustrated in FIG. 6 (S30). Decoder 52 sets a frequency of a verify operation performed during the first time VT1 to one-time (S30), and voltage supply circuit 28 supplies a verify voltage (Vvfyi of FIG. 6, where i is 1, 2, or 3) to selected word line WL3 during first time VT1 according to control code C_CODE output from control logic 50.

Then, under the control of control logic 50, LSB page data is programmed in a page of memory cell array 20 designated by an LSB page address, e.g., a plurality of nonvolatile memory cells connected to selected word line WL3, and a verify operation F is performed once in each program loop PL1 through PL8 for a programmed LSB page data during first time VT1 (S40).

However, where received input address ADD is an MSB page address (S20=No), decoder 52 sets a unit maximum verify time of each program loop PL1' through PL8' to a second time VT2 which is longer than the first time VT1 and transmits a setting result to code generator 54 as illustrated in FIG. 7 (S50).

In the embodiment of FIG. 7, decoder 52 sets the frequency of a verify operation performed during second time VT2 to two times (S50). Accordingly, voltage supply circuit 28 supplies verify voltages (Vvfyi' and Vvfyi of FIG. 7, where i is 1, 2, or 3) for performing two verify operations F and S during second time VT2 to selected word line WL3 successively according to control code C_CODE output from control logic 50.

Under the control of control logic 50, MSB page data is programmed in a page of memory cell array 20 designated by an MSB page address, e.g., a plurality of nonvolatile memory cells connected to WL3, and two verify operations F and S are performed in each program loop PL1' through PL8' for a programmed MSB page data during second time VT2 (S60). Following a successful verification, the program operation is finished. Otherwise, the method is repeated.

Figure 9:
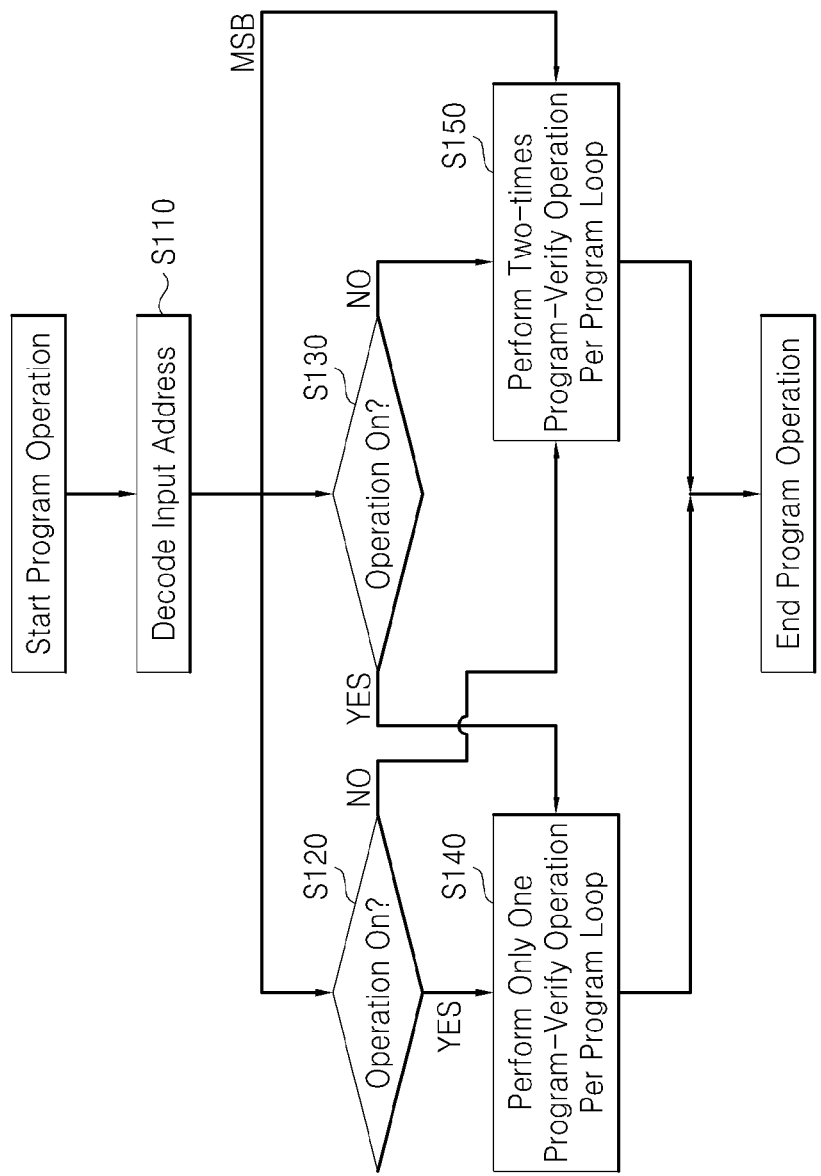
FIG. 9 is a flowchart for explaining a program operation of a page in a three-bit MLC.

FIG. 9 is a flowchart for explaining a program operation of a page in a three-bit MLC. Referring to FIGS. 1, 5, 6, 7 and 9, once a program operation is performed, decoder 52 decodes input address ADD for designating a storage location of a page data to be programmed (S110). Decoder 52 determines whether the received input address ADD is an LSB page address, a CSB page address, or an MSB page address (S120).

Where the received input address ADD is an LSB page address and a frequency adjusting function of a verify operation is selected as an option (S120=Yes), decoder 52 sets a unit maximum verify time of every program loop PL1 through PL8 to first time VT1 and transmits a setting result to code generator 54 as illustrated in FIG. 6. In this case, decoder 52 sets the frequency of a verify operation performed during the first time VT1 to one time.

Voltage supply circuit 28 supplies a verify voltage (Vvfyi of FIG. 6, where i is 1, 2, or 3) for determining each state E, P1, P2 or P3 during first time VT1 to selected word line WL3 according to control code C_CODE output from control logic 50.

Under the control of control logic 50, LSB page data is programmed in a page of memory cell array 20 designated by the LSB page address, e.g., a plurality of nonvolatile memory cells connected to selected word line WL3, and a verify operation F is performed once in each program loop PL1 through PL8 for the LSB page data during first time VT1 (S140).

However, where the received input address ADD is an LSB page address but a frequency adjusting function is not selected as an option (S120=No), decoder 52 sets a unit maximum verify time of each program loop PL1' through PL8' to second time VT2 and transmits a setting result to code generator 54 as illustrated in FIG. 7. In this case, decoder 52 sets the frequency of a verify operation performed during the second time VT2 to two times.

Voltage supply circuit 28 supplies verify voltages (Vvfyi' and Vvfyi of FIG. 7, where i is 1, 2 or 3) for performing two verify operations F and S during second time VT2 to selected word line WL3 successively according to control code C_CODE output from control logic 50.

Under the control of control logic 50, LSB page data is programmed in a page of memory cell array 20 designated by the LSB page address, e.g., a plurality of nonvolatile memory cells connected to selected word line WL3, and two verify operations F and S are performed in each program loop PL1' through PL8' for a programmed LSB page data (S124). Where the LSB page data is successfully programmed, the program operation is finished.

Where the received input address ADD is a CSB page address and a frequency adjusting function is selected as an option (S130=Yes), decoder 52 sets a unit maximum verify time of every program loop PL1 through PL8 to first time VT1 and transmits result of the setting to code generator 54 as illustrated in FIG. 6. In this case, decoder 52 sets the frequency of a verify operation performed during first time VT1 to one time.

Voltage supply circuit 28 supplies a verify voltage (Vvfyi of FIG. 6, where i is 1, 2, or 3) to selected word line WL3 during first time VT1 according to control code C_CODE output from control logic 50.

Under the control of control logic 50, CSB page data is programmed in a page of memory cell array 20 designated by the CSB page address, e.g., a plurality of nonvolatile memory cells connected to the selected word line WL3, and a verify operation F is performed once in each program loop PL1 through PL8 for programmed CSB page data (S140).

However, where the received input address ADD is a CSB page address but a frequency adjusting function of a verify operation is not selected as an option (S130=No), decoder 52 sets a unit maximum verify time of every program loop PL1' through PL8' to a second time (VT2>VT1) and transmits a setting result to code generator 54 as illustrated in FIG. 7. In this case, decoder 52 sets a frequency of a verify operation performed during second time VT2 to two times.

Voltage supply circuit 28 supplies verify voltages (Vvfyi' and Vvfyi of FIG. 7, where i is 1, 2, or 3) for performing two verify operations F and S during second time VT2 to selected word line WL3 according to control code C_CODE output from control logic 50.

Under the control of control logic 50, CSB page data is programmed in a page of memory cell array 20 designated by the CSB page address, e.g., a plurality of nonvolatile memory cells connected to selected word line WL3, and two verify operations F and S are performed in each program loop PL1' through PL8' for a programmed CSB page data during second time VT2 (S124). Once the CSB page data is successfully programmed, a program operation is finished.

Where the received input address ADD is an MSB page address, decoder 52 sets a unit maximum verify time of every program loop PL1' through PL8' to second time VT2 and transmits a result of the setting to code generator 54 as illustrated in FIG. 7. In this case, decoder 52 sets the frequency of a verify operation performed during second time VT2 to two times.

Voltage supply circuit 28 supplies verify voltages (Vvfyi' and Vvfyi of FIG. 7, where i is 1, 2 or 3) for performing two verify operations F and S during second time VT2 to selected word line WL3 according to control code C_CODE output from control logic 50.

Under the control of control logic 50, MSB page data is programmed in a page of memory cell array 20 designated by the MSB page address, e.g., a plurality of nonvolatile memory cells connected to selected word line WL3, and two verify operations F and S are performed in each of program loops PL1' through PL8' for the MSB page data during second time VT2 (S124). Once the MSB page data is programmed successfully, the program operation is completed. Of course, the program operation can be terminated even though data is not successfully programmed.

Figure 10:
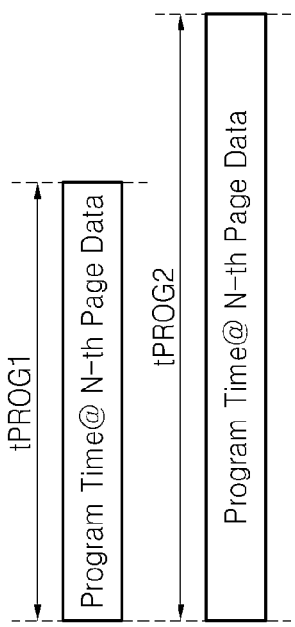
FIG. 10 is a diagram illustrating a program time of $N^{th}$ page data and a program time of a $(N+1)^{th}$ page data.

FIG. 10 is a diagram illustrating a program time of $N^{th}$ page data and a program time of $(N+1)^{th}$ page data. Referring to FIGS. 1 through 10, a program-verify operation of each program loop of the $N^{th}$ page data is performed one time and a program-verify operation of each program loop on the $(N+1)^{th}$ program data is performed twice. Accordingly, a program time of the $N^{th}$ page data tPROG1 is shorter than a program time of the $(N+1)^{th}$ program data tPROG2. For example, as illustrated in FIG. 7, where the time for performing a first program-verify operation F is the same as the time for performing a second program-verify operation S, second time VT2 is twice first time VT1, i.e., VT2=2*VT1.

Figure 11:
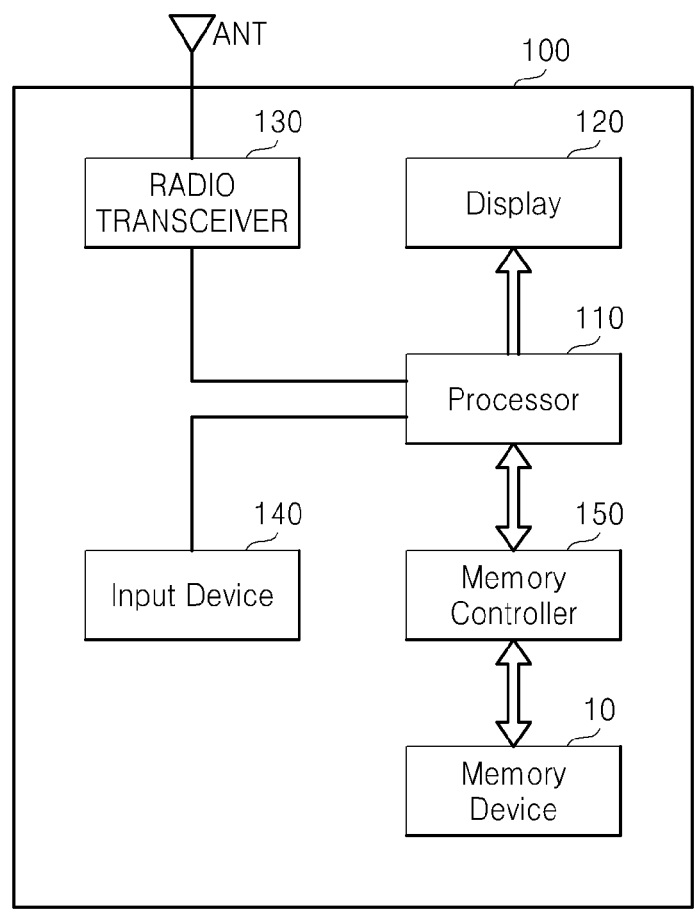
FIG. 11 is a block diagram of a memory system incorporating the nonvolatile memory device illustrated in FIG. 1.

FIG. 11 is a block diagram of a memory system 100 incorporating the nonvolatile memory device illustrated in FIG. 1. Memory system 100 is a wireless mobile device such as a cellular phone, a smart phone, a tablet personal computer (PC), a personal digital assistant (PDA), or a radio communication device.

Referring to FIG. 11, memory system 100 comprises nonvolatile memory device 10 and a memory controller 150 that controls operation of nonvolatile memory device 10. In particular, memory controller 150 controls data access operations of nonvolatile memory device 10, such as program operations, erase operations, or read operations, under the control of a processor 110.

Page data programmed in nonvolatile memory device 10 is displayed on a display 120 under the control of processor 110 and memory controller 150. Radio transceiver 130 transmits or receives a radio signal through an antenna ANT. In addition, radio transceiver 130 can translate a radio signal received through antenna ANT into a signal to be processed by processor 110. Processor 110 processes a signal output from radio transceiver 130 and transmits the processed signal to memory controller 150 or display 120. Memory controller 150 programs a signal processed by processor 110 in nonvolatile memory device 10. Additionally, radio transceiver 130 can translate a signal output from processor 110 into a radio signal and output the translated radio signal to an external device through antenna ANT.

Input device 140 is a device that inputs a control signal for controlling an operation of processor 110 or data to be processed by processor 110. Input device 140 typically takes the form of a touch pad, computer mouse, keypad, or keyboard, although it is not limited to these devices.

Processor 110 controls operations of display 120 so that data output from memory controller 150, data output from radio transceiver 130, and data output from input device 140 is displayed through display 120. Memory controller 150 can be implemented as a part of processor 110, or in a separate chip.

Figure 12:
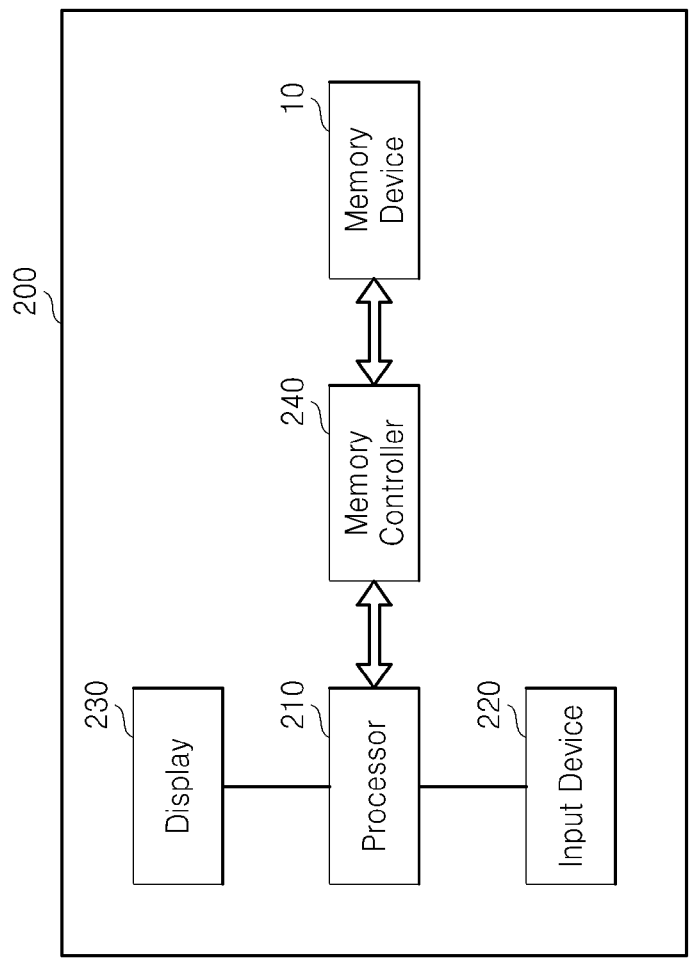
FIG. 12 is a block diagram of another memory system incorporating the nonvolatile memory device illustrated in FIG. 1.

FIG. 12 is a block diagram of a memory system 200 incorporating the nonvolatile memory device illustrated in FIG. 1. Memory system 200 is a computing system such as a personal computer (PC), a tablet PC, a laptop computer, a net-book, an e-reader, a personal digital assistant (PDA), a portable multimedia player (PMP), a MP3 player or a MP4 player.

Referring to FIG. 12, memory system 200 comprises nonvolatile memory device 10 and a memory controller 240 that controls data processing operations of nonvolatile memory device 10.

Processor 210 displays data stored in nonvolatile memory device 10 through a display 230 according to data input through an input device 220. Input device 220 can be embodied in various forms, such as a touch pad or a computer mouse, a keypad or a keyboard.

Processor 210 controls operations of memory system 200 and memory controller 240. Memory controller 240 can be implemented as part of processor 210 or as a chip apart from processor 210.

Figure 13:
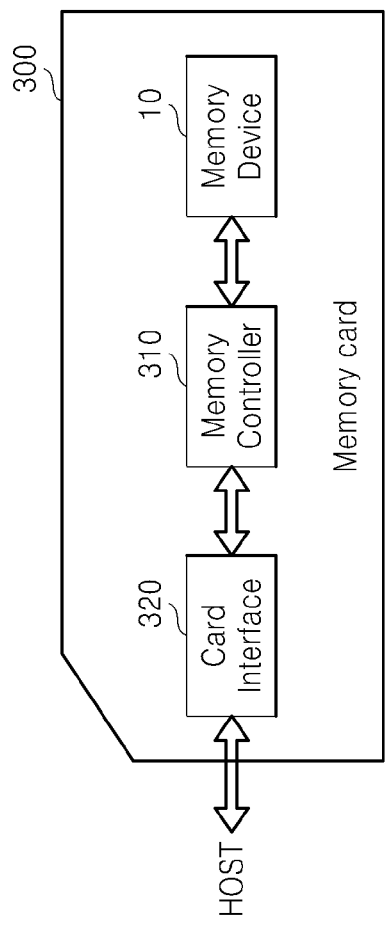
FIG. 13 is a block diagram of another memory system incorporating the nonvolatile memory device illustrated in FIG. 1.

FIG. 13 is a block diagram of a memory system 300 incorporating the nonvolatile memory device illustrated in FIG. 1. Memory system 300 is a card such as a memory card or a smart card.

Referring to FIG. 13, memory system 300 comprises nonvolatile memory device 10, a memory controller 310, and a card interface 320. Memory controller 310 controls data exchange between memory device 10 and card interface 320. Card interface 320 typically comprises a secure digital (SD) card interface or a multi-media card (MMC) interface, but it is not restricted thereto.

Card interface 320 facilitates data exchange between a host and memory controller 310 according to a protocol of the host. In some embodiments, card interface 320 supports a universal serial bus (USB) protocol and/or an interchip (IC)-USB protocol. Here, a card interface may mean hardware supporting a protocol used in a host, software running on the hardware, or a type of signal transmission.

Where memory system 300 is connected to a host such as a PC, a tablet PC, a digital camera, a digital audio player, a cellular phone, console video game hardware or a digital set-top box, the host may perform a data communication with the nonvolatile memory device 10 through card interface 320 and memory controller 310.

Figure 14:
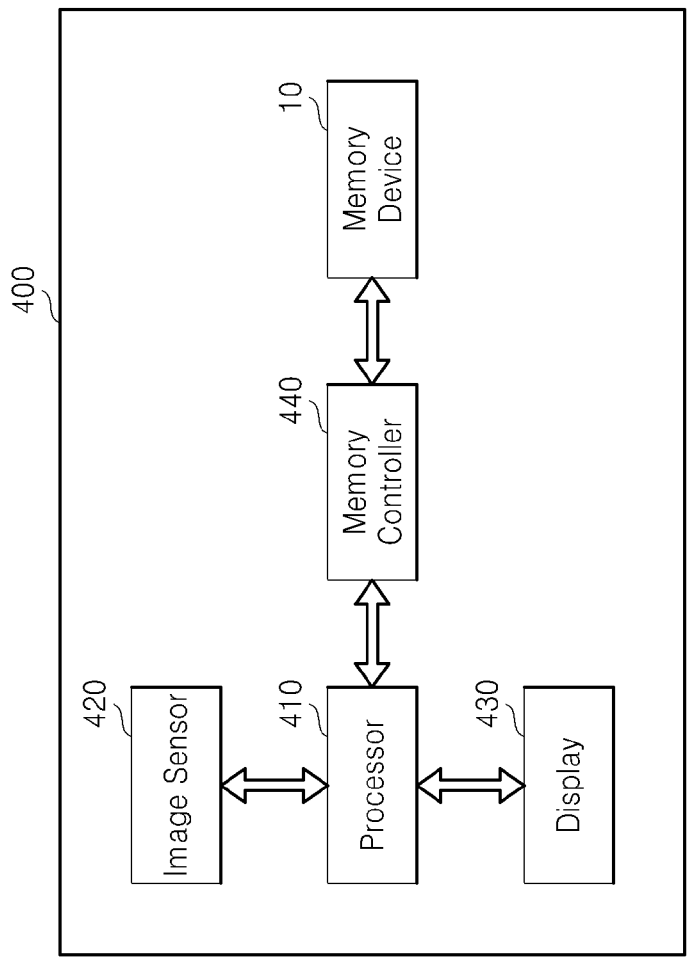
FIG. 14 is a block diagram of another memory system incorporating the nonvolatile memory device illustrated in FIG. 1.

FIG. 14 is a block diagram of a memory system 400 incorporating the nonvolatile memory device illustrated in FIG. 1. Memory system 400 is an image processing device, such as a digital camera or a digital camera-equipped cellular phone.

Referring to FIG. 14, memory system 400 comprises nonvolatile memory device 10 and a memory controller 440 that controls data processing operations of nonvolatile memory device 10, such as program operations, erase operations, or read operations. An image sensor 420 of memory system 400 translates an optical image into digital signals and transmits the translated digital signals to processor 410 or memory controller 440. Under the control of processor 410, the translated digital signals can be displayed through a display 430 or stored in nonvolatile memory device 10 through memory controller 440.

Moreover, data stored in nonvolatile memory device 10 is displayed through display 430 under the control of processor 410 or memory controller 440. Memory controller 440 is typically formed as part of processor 410 or in a separate chip from processor 410.

Figure 15:
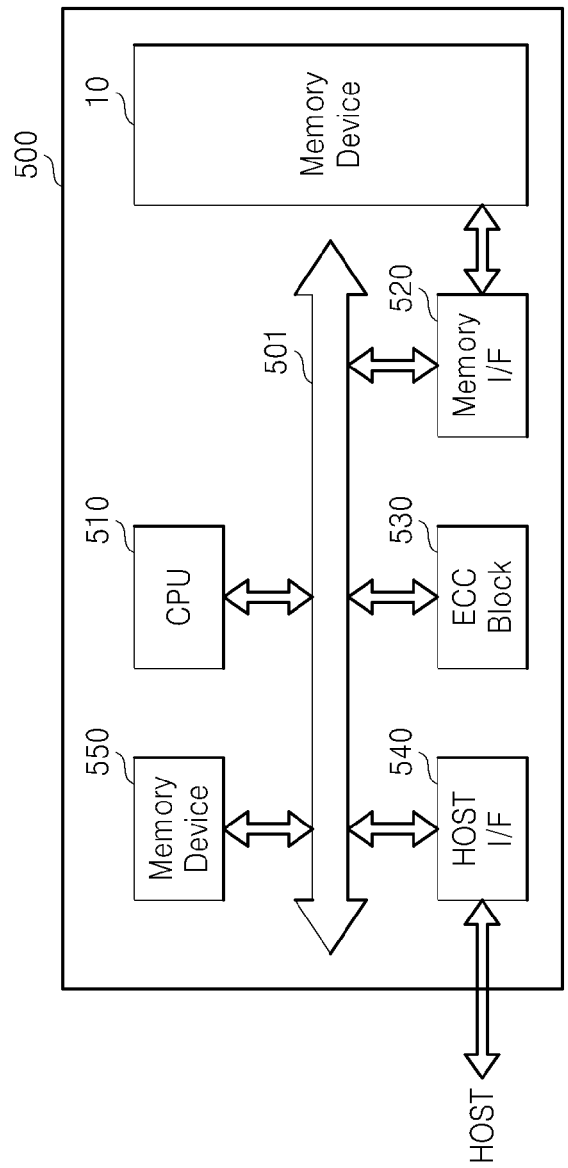
FIG. 15 is a block diagram of another memory system incorporating the nonvolatile memory device illustrated in FIG. 1.

FIG. 15 is a block diagram of a memory system 500 comprising nonvolatile memory device 10 illustrated in FIG. 1. Memory system 500 comprises a portable memory such as a flash memory drive, a USB memory drive, an IC-USB memory drive or a memory stick.

Referring to FIG. 15, memory system 500 comprises nonvolatile memory device 10 and a central processing unit (CPU) 510 that controls operations of nonvolatile memory device 10.

Memory system 500 comprises a memory device 550 that can be used as a working memory of CPU 510. Memory device 550 can take the form of a nonvolatile memory such as a read only memory (ROM) or a volatile memory such as a static random access memory (SRAM).

A host connected to memory system 500 performs data communication with nonvolatile memory device 10 through a memory interface 520 and a host interface 540. Under the control of CPU 510, an error correction code (ECC) block 530 detects an error bit in data output from nonvolatile memory device 10 through memory interface 520, corrects the error bit and transmits error-corrected data to a host though host interface 540. CPU 510 controls data communication among memory interface 520, ECC block 530, host interface 540 and a memory device 550 through a bus 501.

Figure 16:
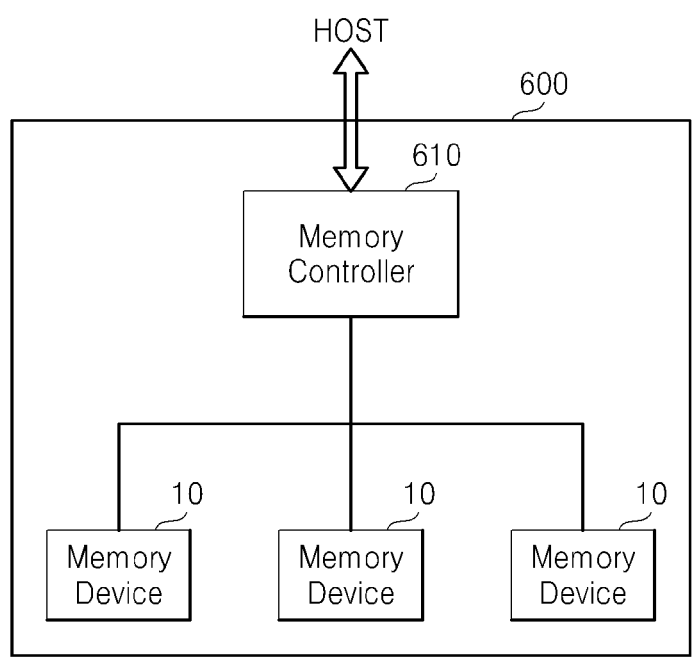
FIG. 16 is a block diagram of another memory system incorporating the nonvolatile memory device illustrated in FIG. 1.

FIG. 16 is a block diagram of a memory system 600 incorporating the nonvolatile memory device illustrated in FIG. 1. Memory system 600 typically forms a processing device such as a solid state drive (SSD), or a memory module.

Referring to FIG. 16, memory system 600 comprises a plurality of memory devices 10 and a memory controller 610 that controls each data processing operation of memory devices 10.

Figure 17:
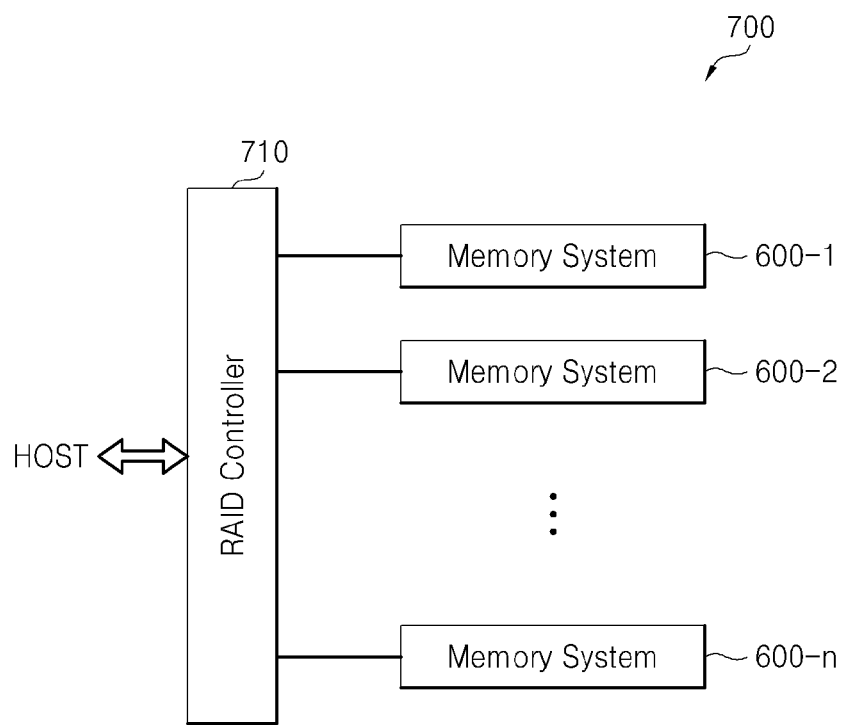
FIG. 17 is a block diagram of a data processing device incorporating the memory system illustrated in FIG. 16.

FIG. 17 is a block diagram of a data processing device 700 incorporating the memory system illustrated in FIG. 16.

Referring to FIG. 17, data processing device 700 is a redundant array of independent disks (RAID) system comprising a RAID controller 710 and a plurality of memory systems 600-1 through 600-n. Each of memory systems 600-1 through 600-n can be implemented the same as memory system 600 illustrated in FIG. 16, and they can be formed as a RAID array. Data processing device 700 can be implemented in a personal computer (PC) or an SSD.

During a program operation, RAID controller 710 outputs program data received from a host to at least one of memory systems 600-1 through 600-n according to a RAID level. During a read operation, RAID controller 710 transmits data read by at least one of memory systems 600-1 through 600-n to the host.

As indicated by the foregoing, a nonvolatile memory device adjusts a maximum verify time of a verify operation within a program loop according to a page address. This can reduce programming time while addressing problems associated with CSL noise.

Although a few embodiments of the inventive concept have been shown and described, it will be appreciated by those skilled in the art that changes may be made in these embodiments without departing from the scope of the inventive concept as defined by the claims.

What is claimed is:

1. A method of operating a nonvolatile memory device, comprising:
   decoding a received address and determining whether the received address is a first type of page address or a second type of page address;

adjusting a number of program verify operations per program loop used to verify a program state of page data according to the determined type of page address; and performing a verify operation using the adjusted number of program verify operations per program loop.

2. The method of claim 1, wherein adjusting the number of program verify operations per program loop comprises:

adjusting a maximum verify time per program loop to a first time where the received address is the first type of page address; and adjusting the maximum verify time per program loop to a second time which is longer than the first time where the received address is the second type of page address.

3. The method of claim 2, wherein a frequency of the verify operation performed during the first time is less than a frequency of the verify operation performed during the second time.

4. The method of claim 1, wherein the first type of page address is an $N^{th}$ order page address, where N is a natural number, and the second page address is a $(N+1)^{th}$ order page address.

5. The method of claim 4, wherein the $N^{th}$ order page address is a least significant bit (LSB) page address and the $(N+1)^{th}$ order page address is a most significant bit (MSB) page address.

6. The method of claim 4, wherein the $N^{th}$ order page address is a least significant bit (LSB) page address or a center significant bit (CSB) page address and the $(N+1)^{th}$ order page address is a most significant bit (MSB) page address.

7. The method of claim 1, wherein performing the verify operation comprises supplying a verify voltage to a selected word line to determine the program state of the page data during the adjusted number of program verify operations.

8. The method of claim 1, wherein the number of program verify operations is adjusted as a consequence of determining that a frequency adjusting function of a verify operation is selected as an option.

9. The method of claim 1, wherein the nonvolatile memory device is a NAND flash memory device.

10. A nonvolatile memory device, comprising:

a memory cell array comprising a plurality of nonvolatile memory cells connected to a plurality of word lines;

control logic configured to decode a received address, determine whether the received address is a first type of page address or a second type of page address, adjust a number of program verify operations used to verify a program state of selected memory cells in each program loop of a program operation according to the determined type of page address, and output a control code corresponding to the adjustment; and a voltage supply circuit configured to supply a verify voltage to a selected word line connected to the selected memory cells according to the control code.

11. The memory device of claim 10, wherein the control logic adjusts the number of program verify operations to a first value where the received address is the first type of page address and adjusts the number of program verify operations to a second value greater than the first value where the received address is the second type of page address.

12. The memory device of claim 11, wherein the voltage supply circuit adjusts a level of the verify voltage several times during a second time corresponding to the number of program verify operations having the second value according to the control code where the received address is the second page address.

13. The memory device of claim 11, wherein the first type of page address is an $N^{th}$ order page address, where N is a natural number, and the second type of page address is an $(N+1)^{th}$ order page address.

14. The memory device of claim 10, wherein the memory cell array is one of a plurality of memory cell arrays that are three-dimensionally stacked.

15. The memory device of claim 10, wherein the memory cell array and control logic form part of a memory card.

16. A method of programming a nonvolatile memory device, comprising:

selecting a page of memory cells; and performing a program operation on the selected page of memory cells, wherein the program operation comprises a plurality of program loops each comprising a program-execution operation and at least one program-verify operation, and wherein a number of program verify operations per program loop is determined by whether the selected page is a first type of page or a second type of page, wherein the first type of page is a least significant bit (LSB) page or a central significant bit (CSB) page and the second type of page is a most significant bit (MSB) page.

17. The method of claim 16, wherein the at least one program-verify operation has a first duration where the selected page is the first type of page, and a second duration twice as long as the first duration where the selected page is the second type of page.

18. The method of claim 16, further comprising:

determining whether the selected page is the first type of page or the second type of page by decoding a page address of the selected page.

19. The method of claim 16, wherein the nonvolatile memory device is a NAND flash memory device.

* * * * *